United States Patent
Orcutt et al.

(10) Patent No.: US 6,687,132 B2
(45) Date of Patent: *Feb. 3, 2004

(54) CONDUCTIVE MEMBER GRID ARRAY INTERFACE FOR MIRROR ARRAY DRIVE APPARATUS

(75) Inventors: John W. Orcutt, Richardson, TX (US); Arthur Monroe Turner, Allen, TX (US); Andrew S. Dewa, Plano, TX (US); Terence J. Murphy, Plano, TX (US); Kim D. Hyland, Fremont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/066,429

(22) Filed: Jan. 31, 2002

(65) Prior Publication Data

US 2002/0118518 A1 Aug. 29, 2002

Related U.S. Application Data

(60) Provisional application No. 60/266,526, filed on Feb. 5, 2001.

(51) Int. Cl.$^7$ ................................................. H05K 7/02
(52) U.S. Cl. ........................................ 361/760; 361/752
(58) Field of Search ................................ 361/752, 784, 361/790, 760, 730, 728, 796; 257/678

(56) References Cited

U.S. PATENT DOCUMENTS

| | | | | | |
|---|---|---|---|---|---|
| 5,159,535 | A | * | 10/1992 | Desai et al. ................ | 361/398 |
| 5,606,447 | A | * | 2/1997 | Asada et al. ................ | 359/199 |
| 5,629,790 | A | * | 5/1997 | Neukermans et al. ......... | 385/18 |
| 6,201,629 | B1 | * | 3/2001 | McClelland et al. ........ | 359/223 |
| 6,253,001 | B1 | * | 6/2001 | Hoen .......................... | 385/17 |
| 6,295,154 | B1 | * | 9/2001 | Laor et al. .................. | 359/223 |
| 6,426,013 | B1 | * | 7/2002 | Neukermans et al. ......... | 216/24 |
| 6,430,332 | B1 | * | 8/2002 | Laor et al. .................. | 359/223 |
| 6,467,345 | B1 | * | 10/2002 | Neukermans et al. .... | 73/504.02 |
| 6,538,799 | B2 | * | 3/2003 | McClelland et al. ........ | 359/291 |

* cited by examiner

Primary Examiner—David Martin
Assistant Examiner—Dameon E. Levi
(74) Attorney, Agent, or Firm—William B. Kempler; W. James Brady, III; Frederick J. Telecky, Jr.

(57) ABSTRACT

The present invention discloses drive apparatus for rotating a mirror used for switching light signals. The drive apparatus has reduced internal wiring and uses a base printed circuit board which is mounted to a support printed circuit board by sandwiching conductive ball connections between matching traces or pads on the two printed circuit boards. A drive module is also included between the two printed circuit boards which can be either a drive coil or an electrostatic plate and is used to rotate the mirrors. The use of the bump grid array or conductive ball connections significantly reduces the amount of internal wiring required.

34 Claims, 9 Drawing Sheets

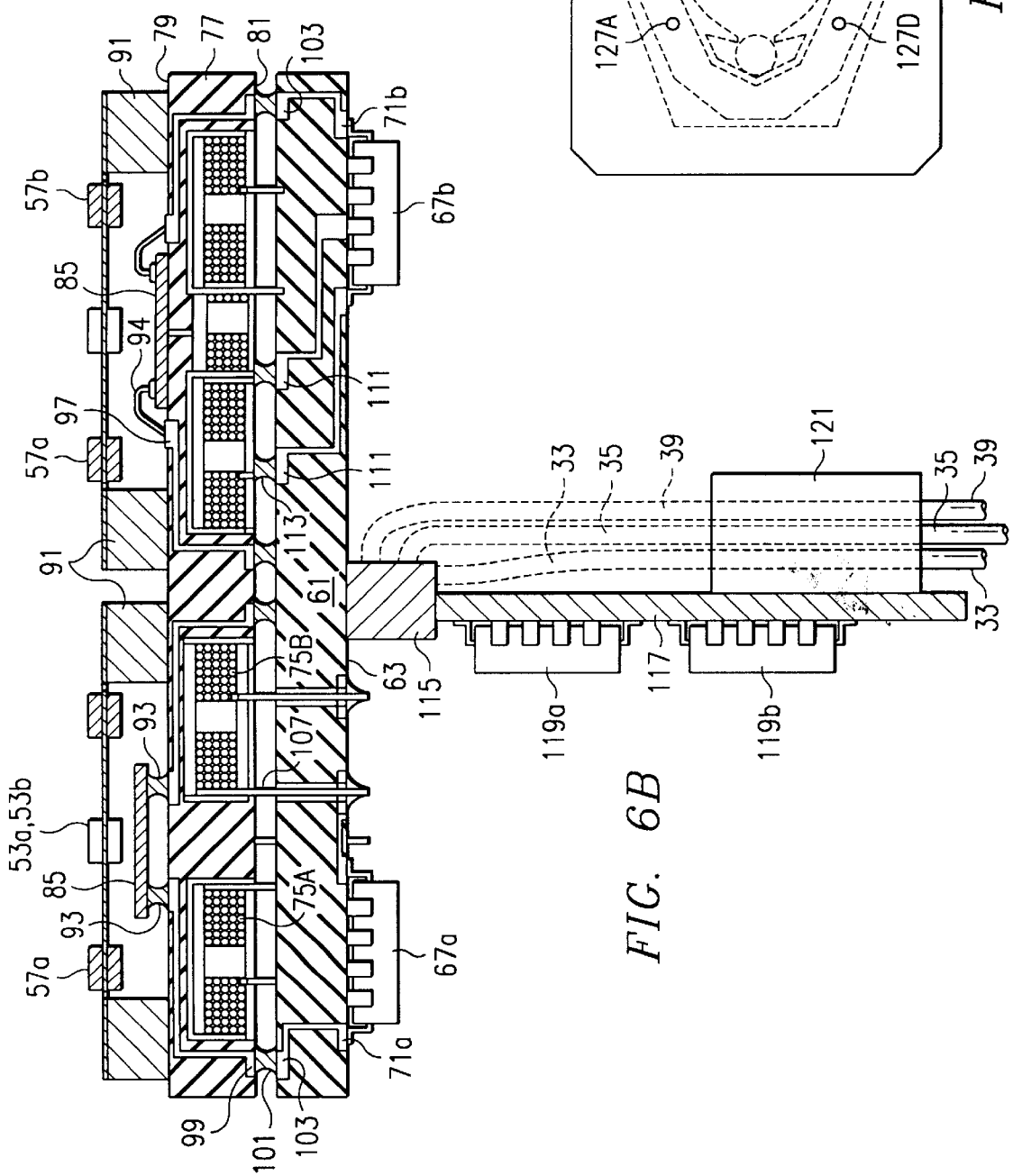

CONDUCTIVE MEMBER GRID ARRAY INTERFACE FOR MIRROR ARRAY DRIVE APPARATUS

This patent claims the benefit of U.S. Provisional Patent Application Serial No. 60/266,526, filed on Feb. 5, 2001.

FIELD OF THE INVENTION

The invention relates generally to apparatus and packaging for optical switching systems and more particularly to packaging for an array of optical switching mirrors having reduced internal wiring connections which is accomplished by incorporating a ball grid array to connect first and second printed circuit boards associated with the array of mirrors.

BACKGROUND OF THE INVENTION

In recent years optical fibers have come into wide spread use in a wide variety of applications in which optical signals are transmitted along such fibers and are switched from one fiber to another by means of an optical switch. Conventional optical switches generally include structure to support fiber positioning, alignment signal emitters and interconnected computer control electronics. A fiber positioning structure is provided near the end of each fiber to selectively point the end of a fiber in one fiber group toward the end of a selected fiber in another fiber group to provide switched optical transmission between the two fibers. An alignment signal emitter is provided near an end of and in predetermined spaced relationship to the end of each fiber to emit an alignment signal for controlling the fiber positioning structure when aligning the ends of selected fibers in the fiber groups for switched optical transmission there between. Examples are shown in U.S. Pat. Nos. 4,512,036 and 5,177,348. This approach requires considerable complexity and duplication of alignment structure and circuits for each alignable fiber. It would be advantageous to reduce this complexity and duplication and to increase speed of switching, reliability, as well as to reduce cost in implementation.

Texas Instruments presently manufactures a two-axis analog mirror MEMS device fabricated out of a single piece of material (such as silicon, for example) typically having a thickness of about 115 m. The layout consists of an oval mirror (normally about 3.8 mm×3.2 mm) supported on a gimbal frame by two silicon torsional hinges. The gimbal frame is attached to a support frame by another set of torsional hinges.

When provided as an individual mirror switching device, the number of electrical connections for input and output signals is small enough that they can reasonably be managed by conventional wire or terminal connections. However, an array of mirrors (such as a 10×10 array) results in such a large number of input/output connections (on the order of about 500 to 600 connections), it is extremely difficult to use conventional wire connections and terminals.

Although not limited to such use, the present invention is particularly suitable as a drive apparatus for the two-axes analog mirror optical switch manufactured by Texas Instruments of Dallas, Tex., or according to another embodiment, an array of such optical switches that overcomes the limitations of the prior art, and which is relatively low in cost, has high speed and is reliable in operation.

For example, presently available optical transmission switches available from Texas Instruments employ a microelectromechanical movable mirror assembly with associated electromagnet coils and may also include control LED's with both drive and LED signals supplied through a standard connector or wiring harness. The drive signals to the electromagnetic coils, and to and from the positional electronics presently requires a nine or ten wire connector and/or harness. However, it is believed that the number of input/output signals per two-axes mirror may be reduced to about five or six signals.

The mirror is typically mounted to a support structure of suitable material, such as ceramic, along with the magnetic coil driving means and a wiring harness. The package is received in a housing in which an optical fiber is received and in which another mirror is disposed in alignment with the fiber for reflecting an optical signal from the fiber to the movable mirror.

SUMMARY OF THE INVENTION

Objects and advantages of the invention will in part be obvious, and will in part appear hereinafter, and will be accomplished by the present invention which provides drive apparatus having reduced internal wiring connections. The drive apparatus is well suited for providing necessary forces such as electromagnetic forces or electrostatic forces for rotating a mirror about at least one axes. The drive apparatus comprises a base printed circuit board which may be made of a ceramic or any other suitable material having a top side and a connecting side. There is a plurality of connecting points on the topside of the base printed circuit board. There is also included at least one drive module such as for example an electromagnetic coil or alternately an electrostatic plate located on the topside of the base printed circuit board and which has input connections. A second or support printed circuit board having a device side and a backside covers the drive module and includes a plurality of connecting points on the backside which corresponds to the plurality of connecting points on the topside of the base printed circuit board. Typically, the plurality of connecting points on the topside of the base printed circuit board is a mirror image of the plurality of connecting points on the backside of the support printed circuit board. There is also included a plurality of conductive balls mounted on one of either the base printed circuit board connecting points or the support printed circuit board connecting points such that selected ones of the connecting points of the support printed circuit board are in electrical contact with selected ones of the plurality of connecting points on the base printed circuit board. Thus, it will be appreciated that connections are made between the backside of the support printed circuit board and the topside of the base printed circuit board by sandwiching the conductive balls there between. It should also be understood that the conductive balls may be mounted to either of the base printed circuit board or the support printed circuit board. Alternately, a portion of the conductive balls could be mounted to the base printed circuit board and the remainder mounted to the support printed circuit board. As mentioned above, the drive apparatus typically is used for providing rotational forces to an optical switching mirror mounted above the drive apparatus. Further, the rotating force may be an electrostatic force or an electromagnetic force provided by at least one coil. According to one embodiment, a single coil may be used to cause rotation of the switching mirror about an axis by providing current flow in one direction. Likewise, rotation can be caused in the opposite direction by reversing the current flow. The rotation around the axis may also be accomplished by using two drive coils rather than a single coil. Likewise, as is discussed in detail hereinafter, rotation of the mirror about two axes may be accomplished by using two coils or four coils.

Thus, it is seen that the mirror of the present invention may provide either one or two axes of rotation and may be driven magnetically or alternately may be driven by electrostatic forces. The mirror used in the assembly is preferably made from a single piece of crystalline material such as silicon and has three portions connected by two sets of hinges. An inner portion forms the mirror. One of the hinge pairs, one hinge on each of two opposite sides of the mirror portion, ties the mirror portion and the middle gimbals portion, which surrounds the mirror portion. This allows the mirror portion to rotate about the gimbals portion, providing the first axis of rotation. The second set of hinges ties the gimbals portion and the frame portion, one hinge on each of two opposite sides on a line disposed, preferably orthogonal or 90° relative to a line drawn through the first set of hinges. This allows the gimbals portion, which carries the mirror, to rotate about the frame portion, providing a second axis of rotation.

In one embodiment, two pair of magnets, one for each axis of rotation, are used to move the mirror portion and are mounted to form a mirror assembly. The first pair of magnets are attached by suitable means to the mirror portion of the mirror assembly, one on each of two opposite sides of a line, 90° relative to a line through the mirror/gimbals portions set of hinges. When subjected to a selected magnetic field, the mirror portion rotates about the mirror/gimbals portions set of hinges, providing the first axis of motion. The second pair of magnets are suitably attached to the gimbals portion of the mirror assembly, one on each of two opposite sides of a line, 90° relative to a line drawn through the gimbals/frame portions set of hinges. In the same manner as discussed above, when subjected to a different magnetic field, the mirror and gimbals portions rotate about the second set of axis, to providing the second axis of rotation.

To obtain extended operation without degradation, the mirror assembly may be hermetically assembled into a cavity in the package to lock out moisture and allow the provision of a benign atmosphere for mirror operation. The cavity can be filled with selected gases to provide improved heat transfer and, if desired, exclude oxygen water vapor and other materials that would adversely affect the mirror over time.

According to one embodiment, the coil drive module preferably employs a push and pull arrangement for driving the mirror magnets to rotate the mirror portion to the desired orientation in its two axes. Four coils, comprising copper wire coiled on a bobbin may be included in the module. The coil leads from the modules are soldered to the ball grid array printed circuit board (BGA-PCB) to allow system electrical control of the coils and their push pull arrangement to drive the mirror assembly. The coil bobbins are preferably made of aluminum or other eddy current generating material, and sufficient amounts of aluminum should be provided at the top and bottom of the bobbins to allow eddy current dampening of the movable portions of the mirror assembly, to prevent unwanted oscillations. In order to prevent overheating and loss of mirror position control, the coil bobbins are made of high heat transfer material, such as aluminum, and the bobbins are massive relative to the coils.

BRIEF DESCRIPTION OF THE DRAWINGS

For a more complete understanding of the present invention and further advantages thereof, reference is now made to the following detailed description of the preferred embodiments taken in conjunction with the drawings in which:

FIG. 6b is a cross-sectional view similar to FIG. 6a after reflow of the solder ball connections. This view also provides a better view of an embodiment having the drive coils inputs provided by solder ball connections.

FIG. 7 is a top view of the support printed circuit board and the position monitoring electrons comprising a single LED and four photo detectors;

DETAILED DESCRIPTION OF EMBODIMENTS OF THE INVENTION

Figure 1A:
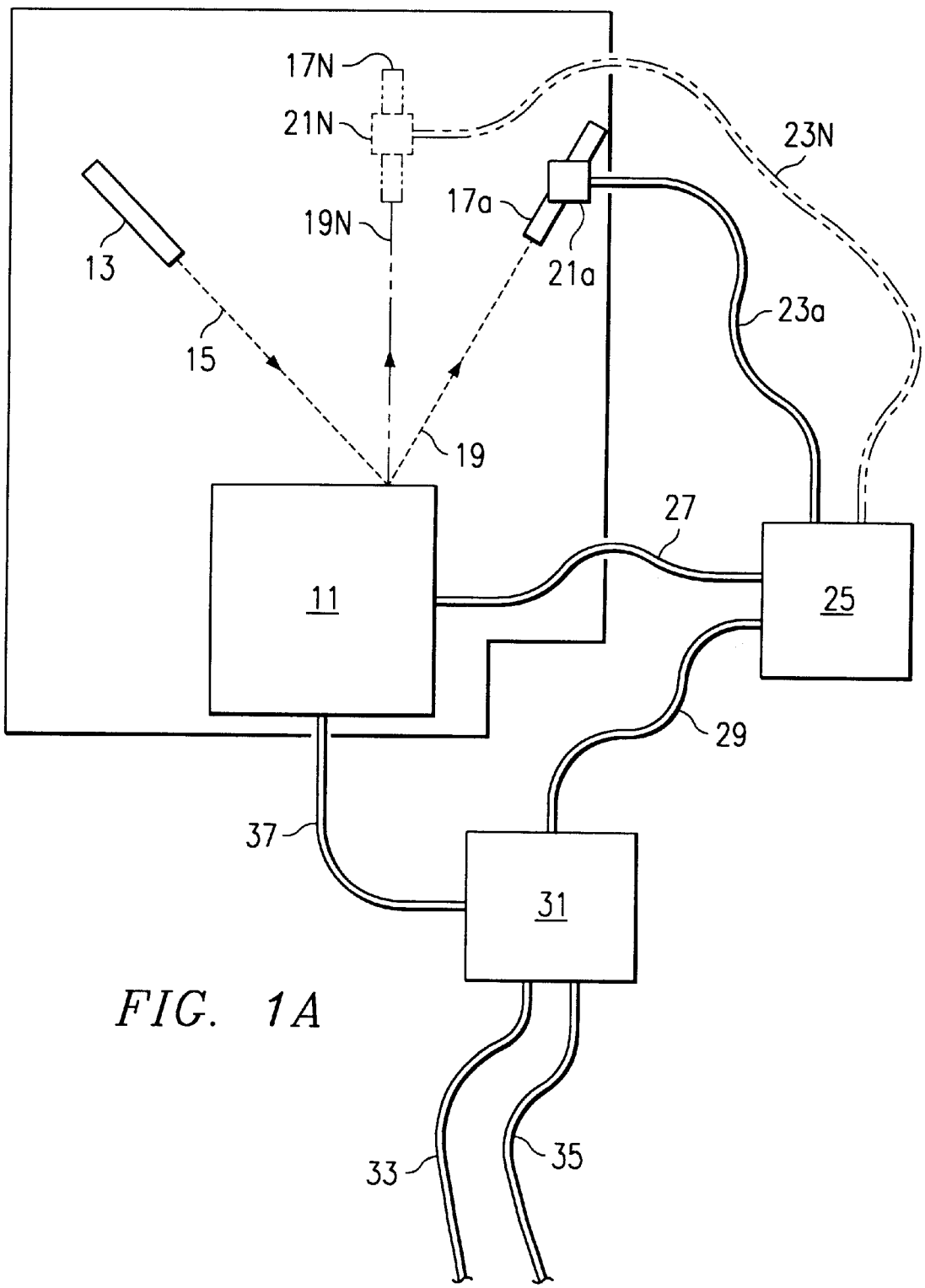
FIGS. 1a and 1b are diagrammatic representations of an optical switching system using an array of mirrors that are selectively rotatable about at least one axis.
Figure 1B:
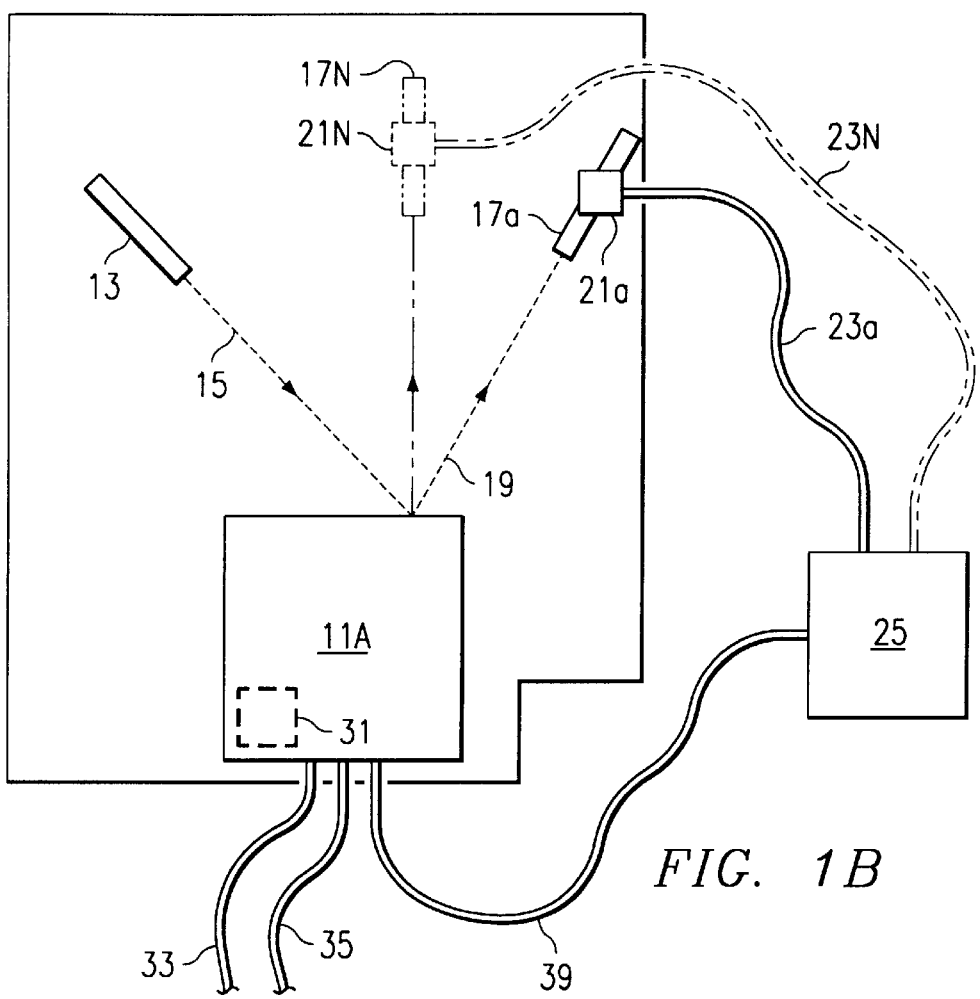

Referring now to FIGS. 1a and 1b, there are shown system level diagrams for providing optical switches by an array of analog mirrors. As shown in FIG. 1a, there is included optical switching apparatus 11 comprising an array of optical mirrors, the associated drivers and the position monitoring electronics. In the illustrated embodiment, there is a source fiber optic 13 which is providing an optical signal carrying data such as a laser beam 15. Also as shown, there is a second optical fiber 17a which is indicated as receiving an optical signal 19 from a mirror on the array of mirrors (not shown) in apparatus 11. There is also indicated another receiving fiber 17n indicated by dotted lines. It will be appreciated by those skilled in the art, that although there are only two receiving fiber optics 17a–17n illustrated in the diagram, there may be tens, hundreds or even thousands of these fibers as indicated by the letter "n" for the fiber optic 17n. Although there may be a huge multiplicity of such optical fibers, it is only necessary to illustrate one emitting fiber (13) and one receiving fiber (17a) to describe the features of the present invention. However, the reader should understand that everything discussed with respect to receiving fiber optic 17a is true for the other multiplicity of fiber optics that may be included. Also as shown, fiber optic 17a includes a beam monitor device 21a for sensing the optical signal strength. The beam monitoring device 21a converts the optical signal to an electrical signal representative of the strength of the beam through electrical or feedback cables 23a. Feedback cable 23a goes to a system control box 25. As will become clear, system control box 25 also receives signals on cable 27 indicative of the position of each of the mirrors of the array of mirrors in the apparatus 11. For a two-axis analog mirror, there may typically be feedback signals provided from four different sensors in apparatus 11 for each of the mirrors of the array. Thus, it can be seen as the size of the array of mirrors in apparatus 11 increases the number of signals required through cable 27 increases substantially. System control box 25 provides the necessary control information signals on cable 29 to the drive electronics 31. Also as shown, drive electronics 31 receives a ground and power line 33 and 35 as indicated. Drive electronics 31 provides the drive signals to the apparatus (such as drive coils or electrostatic plates) used to position the mirrors. These drive signals along with the power and ground lines are provided by cable 37. If the array of mirrors is comprised of two axis mirrors to provide the drive signals, will require three or four lines for each of the mirrors of the array. In addition, if the mirror positioning signals are four photodiodes, there typically will be also a power signal to an LED associated with each of the mirrors. Thus, it will be appreciated that there will typically be about nine different signal leads provided to and from each of the mirrors in the array for a two-axis mirror. The present technique of using individual wires for each of these signals will become very cumbersome as the array of mirrors increases in size to the hundreds or thousands. As will be appreciated, the present invention can be used and relieve some of the difficulties of the many wires required in the system described in FIG. 1a. However, the present invention is even more applicable to the improved system illustrated in FIG. 1b. Those elements of FIG. 1b which are the same as discussed with respect to FIG. 1a carrying the same reference numbers. Although much of the operation is similar to that discussed with respect to FIG. 1a, the apparatus 11a of FIG. 1b also includes the drive electronics 31 which was separated from the array of mirrors in FIG. 1a. Further, as shown, the power and ground leads 33 and 35 go directly into the apparatus 11a and all communications between the apparatus 11a and system control box 25 is provided through high speed serial digital data signals through cable 39. Although there is, of course, an upper limit to the number of mirrors of an array that can be serviced through a single pair of serial control wires 39, in the embodiment shown, a single pair of wires 39 is sufficient to carry all the necessary data and signal between apparatus 11a and system control box 25 in both directions for the number of mirrors in the size of arrays presently contemplated. As will be apparent hereinafter, the features of the present invention facilitate the significant reduction in the amount of wires leading to and from an array of mirrors.

Figure 2:
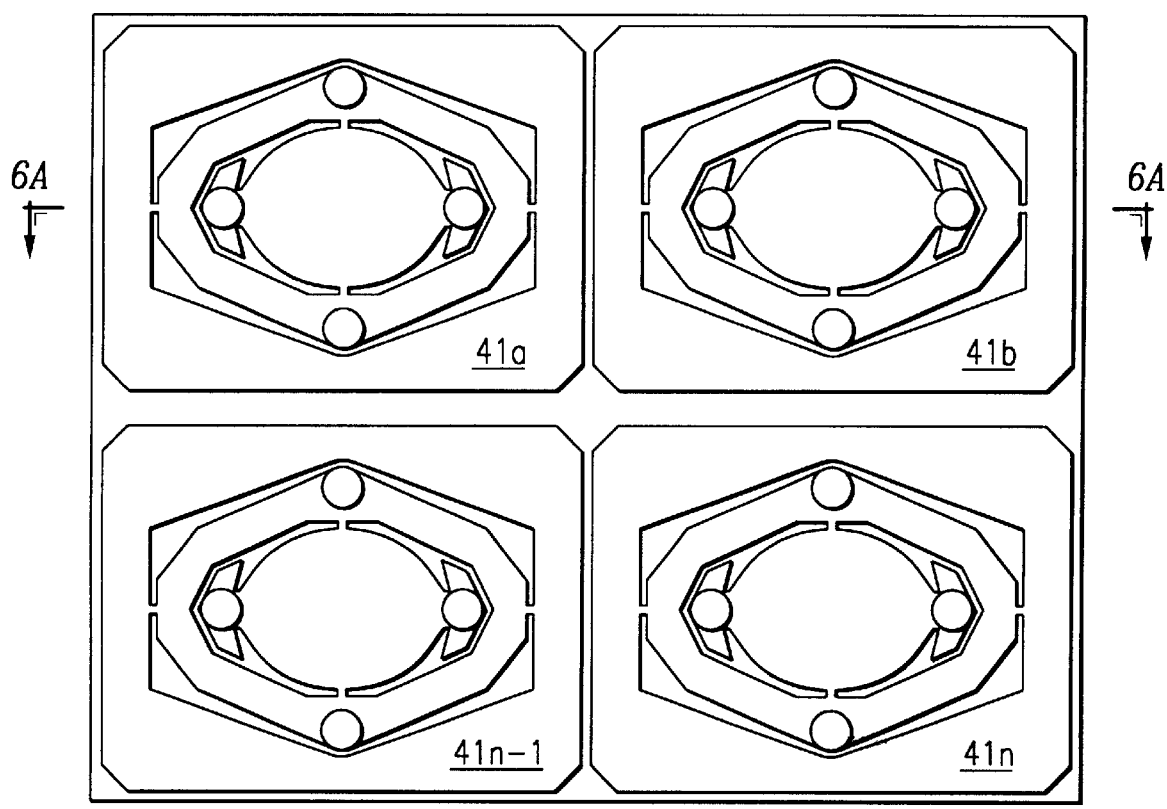
FIG. 2 illustrates a top view of an array of four mirrors suitable for being controlled by the drive apparatus of the present invention.
Figure 3:
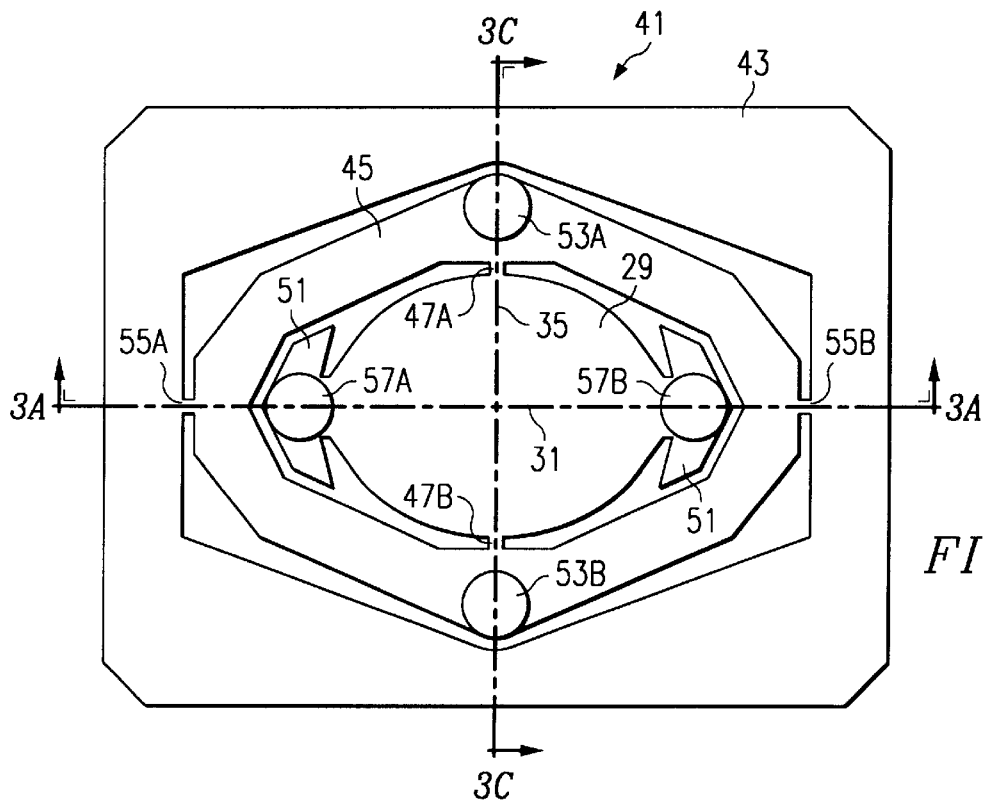
FIG. 3 is a plan view of a mirror assembly used in the FIG. 2 switch unit.

As was discussed above, apparatus 11 of FIG. 1a and 11a of FIG. 1b include an array of mirror devices such as indicated in FIG. 2. Although FIG. 2, for simplicity, illustrates only four mirror devices 41a, 41b, 41n-1 and 41n, it will be appreciated that the array will typically be larger than four. For example, arrays comprising eight mirrors up to an array 10×10 or 100 mirrors are presently being considered. Since each of the mirrors of the mirror array operate in the same manner, FIG. 3 illustrates a single one of the mirrors comprising the array shown in FIG. 2. It should also be appreciated that although the present invention provides particular advantages to a large array of many mirrors, the features of the invention are equally suitable for a single mirror device.

Therefore, the following discussion illustrates the operation of various embodiments of mirrors suitable for use with the invention. Mirror assembly 41, FIG. 3, includes a frame portion, an intermediate gimbals portion and an inner mirror portion preferably formed from one piece of crystalline material such as silicon. The silicon is etched to provide outer frame portion 43 forming an opening in which intermediate annular gimbals portion 45 is attached at opposing hinge locations 55A and 55B along first axis 31. An inner, centrally disposed mirror portion 29, having a mirror centrally located thereon, is attached to gimbals portion 45 at hinges 47A and 47B along a second axis 35 that is orthogonal or rotated, 90° from the first axis. The mirror on mirror portion 29, which is on the order of 100 microns in thickness, is suitably polished on its upper surface to provide a specular or mirror surface. In order to provide necessary flatness, the mirror is formed with a radius of curvature greater than approximately 2 meters, with increasing optical path lengths requiring increasing radius of curvature. The radius of curvature can be controlled by known stress control techniques such as, by polishing on both opposite faces and deposition techniques for stress controlled thin films. If desired, a coating of suitable material can be placed on the mirror portion to enhance its reflectivity for specific radiation wavelengths.

Mirror assembly 41 also comprises a first pair of permanent magnets 53A and 53B mounted on gimbals portion 45 along the second axis 35 and a second pair of permanent magnets 57A and 57B mounted on extensions 51, which extend outwardly from mirror portion 29 along the first axis. In order to symmetrically distribute mass about the two axes of rotation to thereby minimize oscillation under shock and vibration, each permanent magnet 53A, 53B, 57A and 57B preferably comprises a set of an upper magnet mounted on the top surface of the mirror assembly 41 using conventional attachment techniques such as indium bonding, and an aligned lower magnet 53b similarly attached to the lower surface of the mirror assembly as shown in FIGS. 3a–3d. The magnets of each set are arranged serially such as the north/south pole arrangement indicated in FIG. 3c. There are several possible arrangements of the four sets of magnets which may be used, such as all like poles up, or two sets of like poles up, two sets of like poles down; or three sets of like poles up, one set of like pole down, depending upon magnetic characteristics desired.

By mounting gimbals portion 45 to frame portion 43 by means of hinges 55A and 55B, motion of the gimbals portion 45 about the first axis 31 is provided. Similarly, by mounting mirror portion 29 to gimbals portion 45 via hinges 47A and 47B, motion of the mirror portion relative to the gimbals portion is obtained about the second axis 35, thereby allowing independent, selected movement of the mirror portion 29 along two different axes.

Figure 3A:
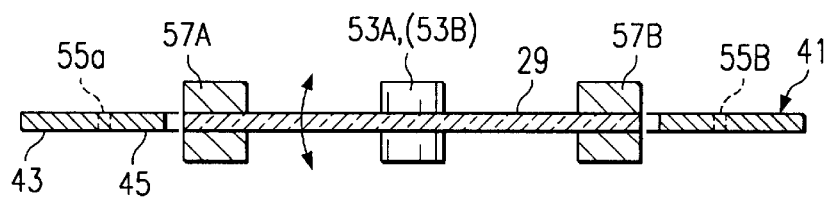
FIG. 3a is a cross sectional view taken on line 3A—3A of FIG. 3.
Figure 3B:
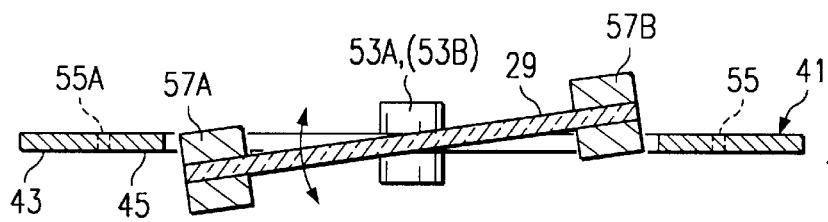
FIG. 3b is a view similar to FIG. 3a but showing rotation of the mirror portion of the mirror assembly.
Figure 3C:
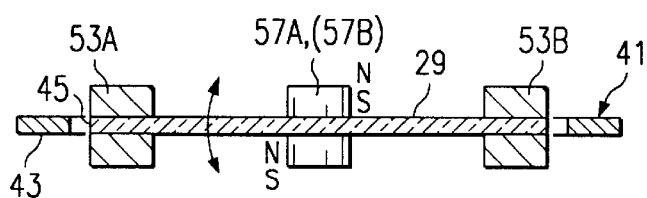
FIG. 3c is a cross sectional view taken on line 3C—3C of FIG. 3.
Figure 3D:
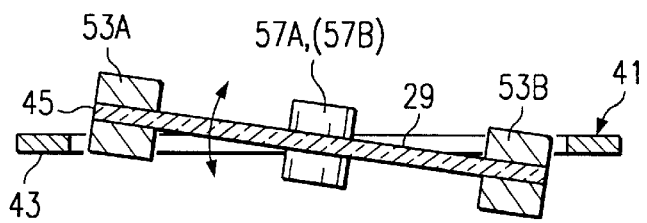
FIG. 3d is a view similar to FIG. 3c but showing rotations of the gimbals portion of the mirror assembly.

The middle or neutral position of mirror assembly 41 is shown in FIG. 3a, which is a section taken through the assembly along line 3A—3A of FIG. 3. Rotation of mirror portion 29 about axis 35 independent of gimbals portion 45 and/or frame portion 43 is shown in FIG. 3b as indicated by the arrow. FIG. 3c shows the middle position of the mirror assembly 41, similar to that shown in FIG. 3a, but taken along line 3C—3C of FIG. 3. Rotation of the gimbals portion 45 and mirror portion 29 about axis 31 independent of frame portion 43 is shown in FIG. 3d as indicated by the arrow. The above independent rotation of mirror portion 29 about the two axes allows direction of optical beam 15 to the appropriate receiving optical fiber 17 through 17n as needed by the optical switch units.

In order to protect the torsional hinges 47A, 47B, 55A and 55B from in-plane shock during handling and shipping, stops (not shown) may be provided as an optional feature of the invention. AT this point, it should be noted that the mirror assembly is on the order of 100 microns thick, whereas the hinges of the same thickness are on the order of 10 microns wide, thereby providing robust strength in directions normal to the surface of the assembly. In order to provide protection against excess in-plane motion 90° to the axis of the hinge, for example, axis 31, cooperating surfaces may be formed on gimbals portion 45 and frame portion 43.

The magnet drive for the magnets according to one embodiment of the invention comprise two pairs or four coils such as the pair of coils 75a and 75b shown in FIGS. 6a and 6b discussed in detail hereinafter. Each of the coils of a pair is wound on a bobbin and aligned with respective recesses 83a and 83b and magnets 57a and 57b. The bobbin is made of suitable material such as aluminum for good heat transfer, magnetic dampening, and strength. The coils are wound using high electrical conductivity materials such as copper. The bobbin and coil is disposed proximate to the device side 79 of support printed circuit board 77 such that the coil is as close to magnets 57a and 57b to provide full mirror rotation using minimum power.

Figure 4:
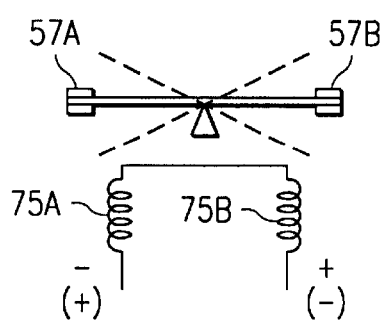
FIG. 4 is a schematic diagram illustrating one embodiment of the electrical connection for a pair of coils associated with one axis of rotation.

Although the arrangement and operation of the movable mirror has been described with regards to specific embodiments thereof, variations and modifications will become apparent to those skilled in the art. For example, magnet and coil locations other than those described above can be employed as long as appropriate currents can be applied to the air coils to move the gimbaled mirror to a desired orientation. The two coils associated with rotation or movement along an axis can of course operate independently. However, with reference to the two pairs (or four coil) arrangement shown, a push-pull drive coil arrangement for each axis as shown in FIG. 4 is particularly suitable. As indicated in FIG. 4, the two coils 75a and 75b for providing movement about axis 35 may be connected in series such that one coil attracts the associated permanent magnet 57a or 57b and the other coil repels its associated magnet in response to a DC signal. Then, by simply reversing the direction of the current, the mirror can be moved in the opposite direction. A similar arrangement would be used for coils working with magnets 53a and 53b for providing rotation about axis 31. It should also be appreciated that a single coil with or without an associated permanent magnet can also provide movement about an axis. Further, it may also be desirable to provide rotation from a neutral position in only one direction.

In addition, it may be sufficient that the mirror rotate only about a single axis. Such an arrangement could of course use the two-axis mirror arrangement shown in FIG. 3, by not providing (or not activation) drive coils for one of the axis. However, if a single axis operation is desired, a more rugged mirror arrangement would be to provide mirrors with only a signal axis 35 of rotation such as illustrated in FIG. 5.

Further, although permanent magnets are shown attached to the movable mirror assembly, it will be appreciated that, if desired, magnetic material could be added to the assembly instead of the permanent magnets and polarized perpendicular to the mirror surface.

Figures 5, 6A:
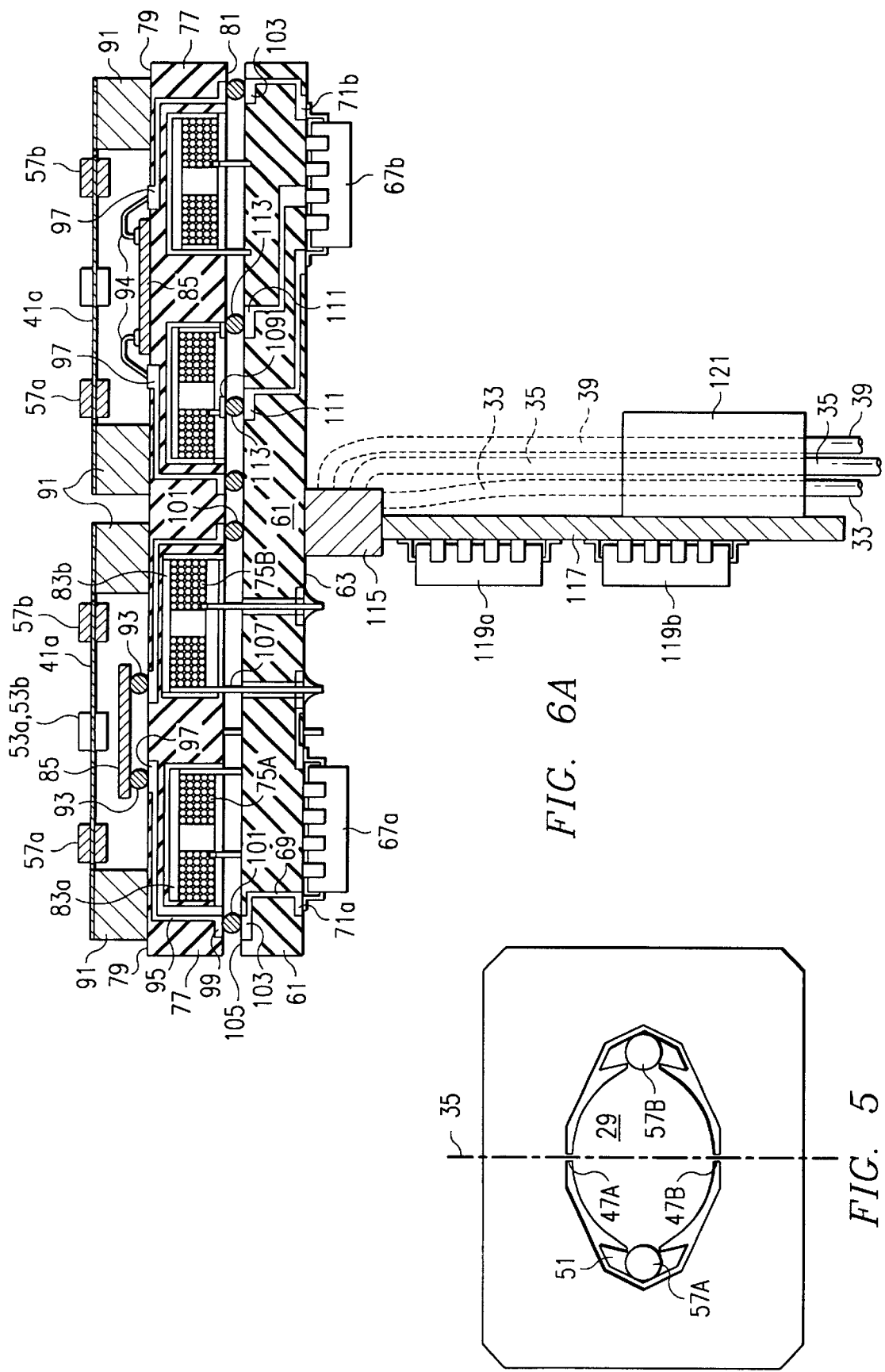
FIG. 5 is a top view of a mirror having a single axis of rotation.
FIG. 6a represents a cross sectional view of the apparatus of the present invention taken along line 6A—6A of FIG. 2 of a two axis embodiment using drive coils to achieve rotation and prior to reflow of the solder ball connections.

Referring now to FIGS. 6a and 6b, there are shown cross-sectional views of one embodiment of a two-axis mirror array of FIG. 2 that employs electrical coils for providing electromagnetic forces to rotate the mirrors. As shown, there is a base printed circuit board 61 having a connecting side 63 and a topside 65. As indicated, connecting side 63 may include printed conductive traces such that selected electronics such as electronic chips 67a and 67b may be electrically mounted. Likewise, topside 65 will also include conductive traces that are used for making electrical connections. As an example only, there is an electrical trace 69 which goes through the multi-layer printed circuit board 61 to a conductive trace 71a on connecting side 63. It will be appreciated that as mentioned, base printed circuit board 61 may be a multi-layer printed circuit board or may simply be a two-sided circuit board. Also shown in the embodiment of FIGS. 6a and 6b, base printed circuit board 61 may include a plurality of apertures there through, which according to the illustrated embodiment, allows the insertion of coil leads through the topside 65 of circuit board 61 to the bottom side 63 such that these coil leads may be soldered to the conductive traces on bottom side 63. In the embodiment shown, each mirror structure also includes a pair of drive coils 75a and 75b used for providing an electromagnetic force for causing rotation of the mirror as discussed above. For a single axis mirror, there may be two drive coils per mirror according to the illustrated embodiment, but as was discussed, a single-axis mirror may instead use only a single coil. In addition to drive coil 75a and 75b, there will be another pair of similar coils (not shown) located substantially orthogonal to coils 75a and 75b for a two-axis mirror.

From the previous discussion concerning the mirror array of FIG. 2, it is seen that there is needed some force for rotating the mirrors to the selected position. Therefore, there will be included at least one drive module located on the topside of the base printed circuit board 61 and below the mirrors 41a. In the embodiment shown in FIGS. 6a and 6b, there is included two drive modules, which according to this embodiment, are shown as coils 75a and 75b. The drive modules such as drive coils 75a and 75b are covered by a support printed circuit board 77 having a device side 79 and a backside 81. As was the case with respect to the base printed circuit board 61, the support printed circuit board 77 also includes conductive traces on the device side 79 and backside 81. Also as shown, support printed circuit board 77 according to the illustrated embodiment, each mirror structure includes recesses 83a and 83b for receiving drive coils 75a and 75b.

Position monitoring electronics 85 which will be discussed in detail hereinafter are mounted to conductive traces on the topside 79 of support printed circuit board 77. The array of mirrors is mounted above the drive coil 75a and 75b and the position monitoring electronics 85 by spacers 91.

As shown in FIG. 6a, position monitoring electronics 85 are mounted to the device side 79 of support printed circuit board 77 by means of conductive balls 93. In the cross-sectional view, there are shown only two conductive balls 93 for connecting the mirror position monitoring circuitry to support printed circuit board 77. However, it should be understood that for a two-axis mirror arrangement, there may be four or more photodiodes along with a photon source, such as for example a light-emitting diode (LED). Consequently, it should be appreciated that there may well be significantly more than the two conductive balls for each position circuitry. The two conductive balls 93, therefore, are shown for explanation purposes only and are not intended to be limiting. Further, as will be appreciated by those skilled in the art, FIG. 6a illustrates the conductive ball connections before "reflow of the solder or conductive balls." FIG. 6b, as discussed later, illustrates the solder connections after reflow. It will also be appreciated that normal wire bonds or connections could be used instead of conductive balls. For example, as shown on the right side of FIGS. 6a and 6b, wire bonds 94 could be used to connect the position monitoring circuitry 85 to traces 97.

It should also be appreciated of course that for the position monitoring signals from circuitry 85 to be provided to the system control box 25 as discussed with respect to FIGS. 1a and 1b, these signals are first provided to control electronics such as the control electronic chips 67a and 67b for conditioning and processing. Consequently, it is necessary that the signal somehow be routed from the conductive balls 93 to electronic control chip 67a and 67b. To accomplish this, it will be appreciated that support printed circuit board 77 likewise includes electrical conductors which extend from traces on the device side surface 79 to traces on the backside 81 of support printed circuit board 77. Therefore, as shown, there is included a conductive path 95 extending from the conductive pad trace 97 on the device side 79 of support printed circuit board 77 through the support board to a conductive pad or trace 99 on the backside 81 of support printed circuit board 77. Of course, as will be appreciated by those skilled in the art, there must also be an electrical connection between pad 99 on the backside 81 of support printed circuit board 77 to trace 71a on the connecting side of base circuit board 61 so that the signals can be provided to the chips or electronic circuits 67a and 67b mounted to the connecting side 63 of base printed circuit board 61. To accomplish this, the present invention uses conductive balls 101 as the connecting medium on the backside 81 of support printed circuit board 77 to traces 103 on the topside 65 of base printed circuit board 61. Then as discussed above, conductive path 69 extends from trace or pad 103 to a corresponding pad or trace 71a on the connecting side 63 of base printed circuit board 61. Further as shown, control electronic circuits or chips 67a and 67b are mounted to the bottom side by connecting side 63 of base printed circuit board 61 and receives the position monitoring signal. Thus, it will be appreciated that although the embodiment of FIG. 6a shows only a small number of conductive balls 101 making contact between the traces on the backside of support printed circuit board 77 and traces on the topside 65 of base printed circuit board 61 for two switching mirrors, there may well be at least 10 such conductive balls required.

In addition, position monitoring of the mirror could also be accomplished by sensing a capacitance change due to mirror movement as will be discussed hereinafter.

As stated above, only a few of the connections are shown for simplicity and to avoid clutter and confusion. In addition, although the drive coils 75a and 75b are illustrated as having elongated terminals or leads 107 extending through vias 73 in base printed circuit board 61 to pads 71b on the connector side 63 of base printed circuit board 61 where they are soldered, it will be appreciated that the drive coil 75a could instead terminate at connection points or pads 109. In such a design, the vias between top surface 65 to the connecting surface 63 of base printed circuit board 61, would instead be conductive paths extending from pads 111 on the top side 65 of base printed circuit board 61 to pads 71b on the connector side 63 of base printed circuit board 61. Therefore, for there to be a conductive path between the connection points 109 of drive coil 75a and 75b to the pads 111 on the top surface 65 of base printed circuit board 61, there will be also necessarily be additional conductive balls between these pads such as the conductive balls 113.

It will be appreciated that there may also be a substantial number of connections that must be made between the bottom surface 81 of support printed circuit board 77 and the topside 65 of base printed circuit board 61. Thus, the drive apparatus of the present invention provides a compact package by using the conductive balls sandwiched between the base printed circuit board and the support printed circuit board. Further, as mentioned above FIG. 6b illustrates the somewhat "hourglass" shape of the conductive ball connections after heating and reflow.

Of course, it is also necessary that even though the signals reach the connector side 63 of base printed circuit board 61, the signals be provided to the system control box 25 and 25a as illustrated in FIGS. 1a and 1b. Therefore, there is shown a connector member 115 attached to the bottom surface 63 of base printed circuit board 61. Connector 115 may be a pin connector or could simply be soldered to base printed circuit board 61. Connector 115 itself could then be attached directly to the ground line 33, the power line 35 and the digital serial cable 39 as shown in dotted lines. Alternatively, a further signal conditioning or process is required. A second printed circuit board 117 on which there could be mounted further chips or control electronics 119a and 119b may be mounted to connection 115. Printed circuit board 117 could then in turn be connected to the ground signal 33 power signal 35 and serial digital cable 39 by circuitry 121.

Referring now to FIG. 7, there is shown position monitoring electronics comprised of a single LED 125 and four photo detectors 127a, 127b, 127c and 127d around the parameter of the mirror, which is shown in dotted lines. The position of the mirror is determined by the amount of light from LED 125 received by the four various photo detectors.

Figure 8A:
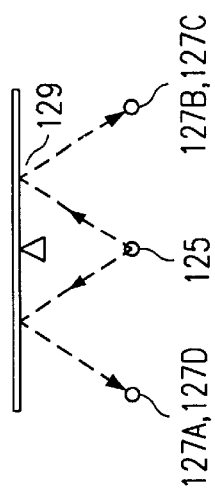
FIGS. 8a and 8b are schematic views illustrating the operation of the LED and four photo detectors of FIG. 7 as the position monitoring electronics.
Figure 8B:
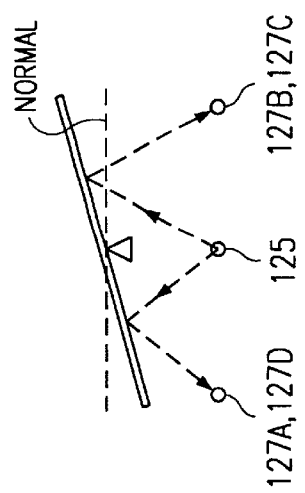

Referring now to FIGS. 8a and 8b there is shown a schematic illustrating this technique. As shown in FIG. 8a, mirror 192 has not been rotated and light from light emitting diode 125 is received substantially equal at all four of the photo detectors 127a–127d. Thus, as shown, for photo detecting diodes 127a and 127d the light path distance from LED 125 is substantially the same as it is to photo detectors 127c and 127d. Consequently, the amount of light received at all four detectors is substantially the same. However, as shown in FIG. 8b, mirror 129 has been rotated around its axis such that the mirror 41 tilts toward photo detectors 127a and 127d while tilting away from photo detectors 127b and 127c. Thus, the light path from LED 125 to 127 photo detectors 127a and 127b is now shorter than the light path between LED 125 and photo detectors 127b and 127c. Thus, light detectors 127b and 127c will not receive as much light, whereas photo detectors 127a and 127d will receive greater amounts of light.

Figure 9:
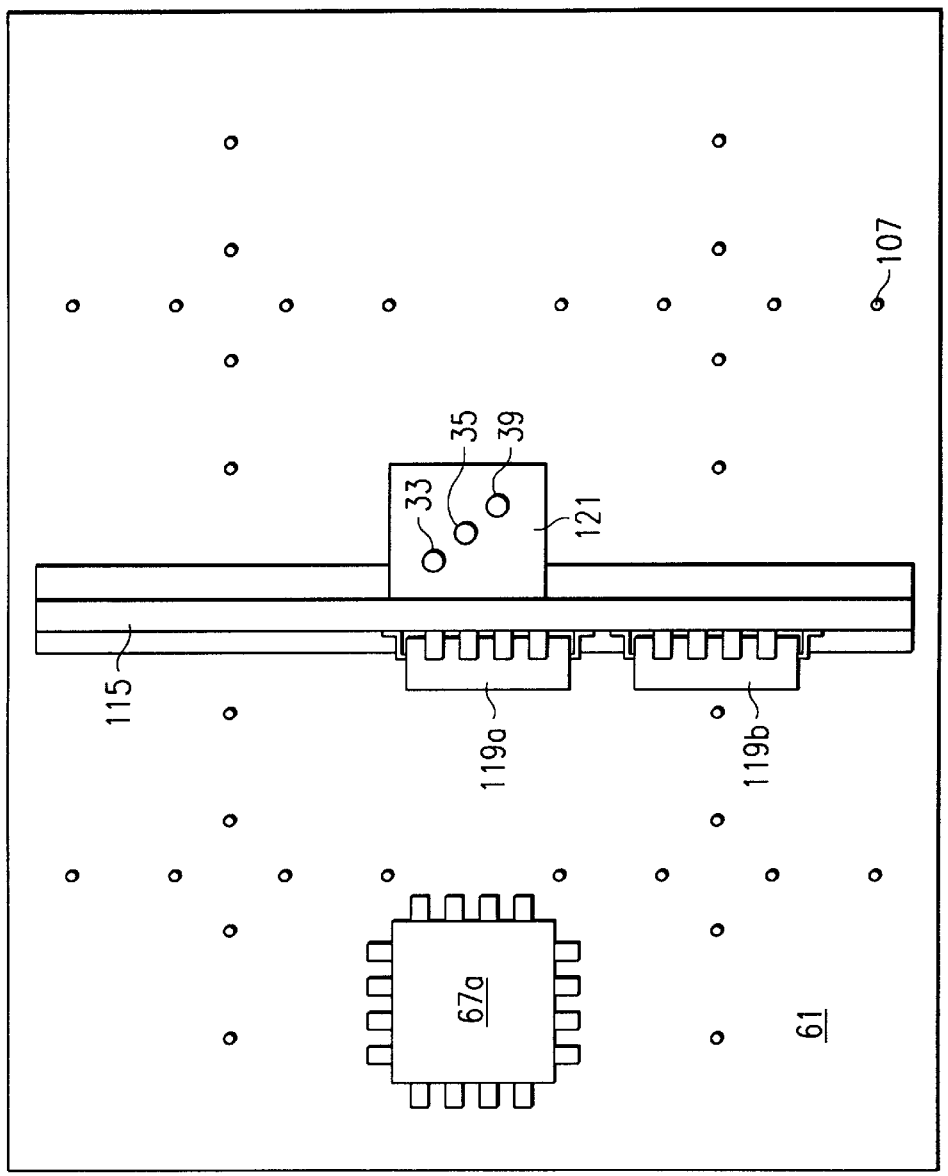
FIG. 9 represents a bottom view of the apparatus shown in FIGS. 6 and 7.

Referring now to FIG. 9, there is shown a bottom view of the embodiment shown in FIG. 6. The bottom view illustrates the presence of the chips or control electronics 67a and the coil terminals 107, along with the additional control electronics 119a.

Figure 10:
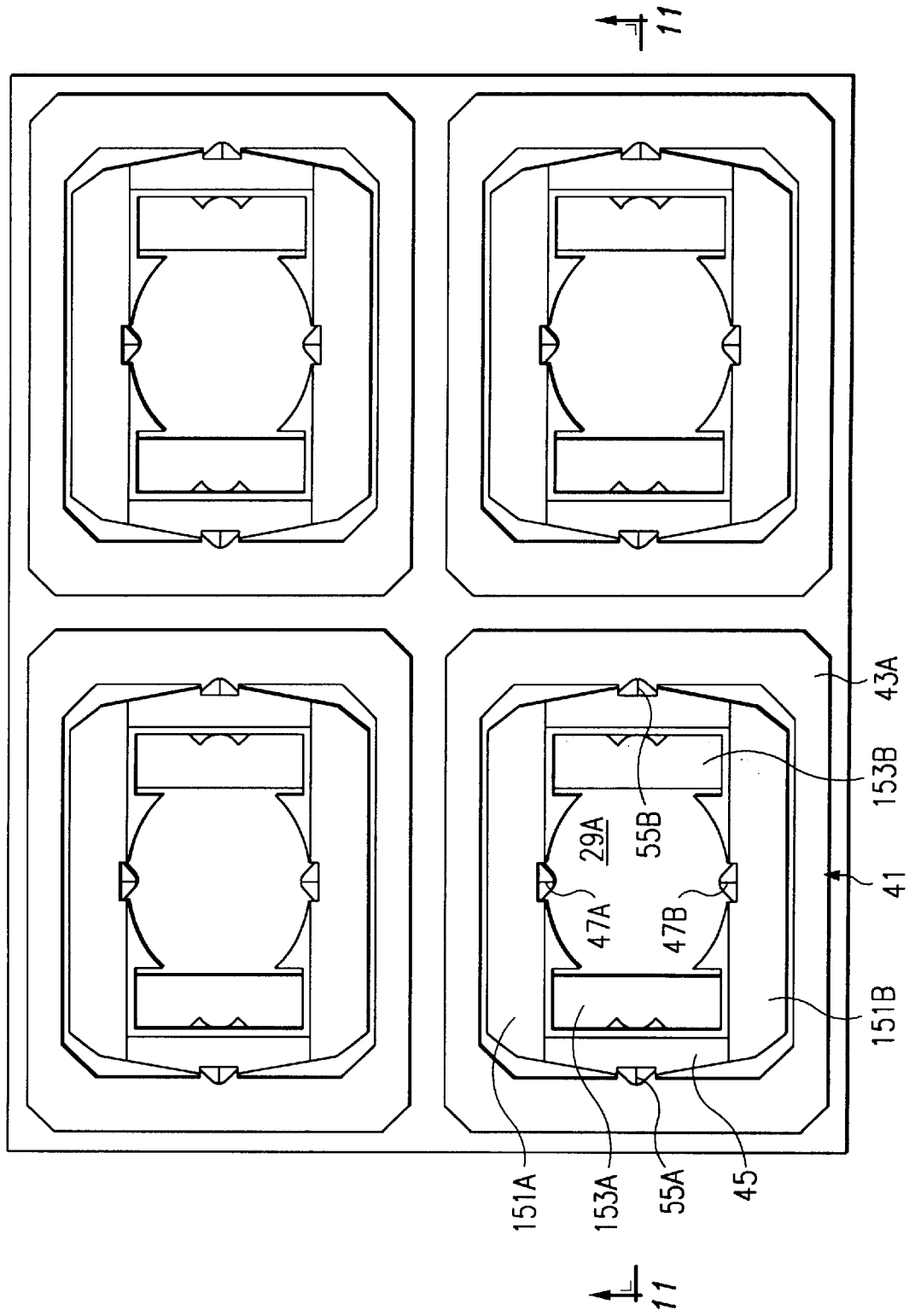
FIG. 10 is a top view of the apparatus of an array of four mirrors using electrostatic forces to achieve rotation.
Figure 11:
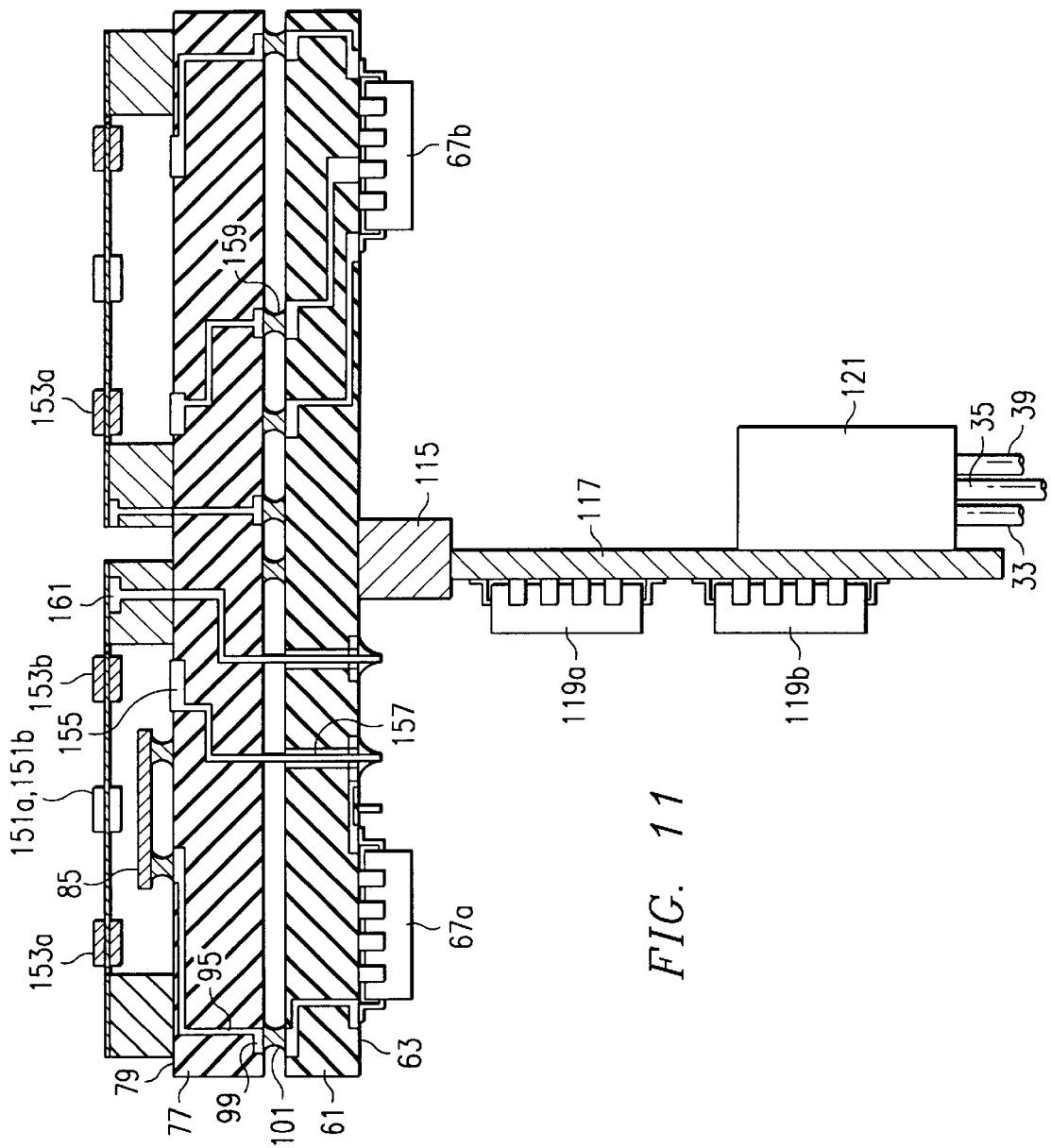
FIG. 11 is a cross-sectional view of FIG. 10 taken along lines 11A—11A after solder ball connection reflow.

Referring now to FIGS. 10 and 11, there is shown another embodiment of the present invention wherein electrostatic forces rather than magnetic forces are used to achieve rotation of the mirror. Those portions of the mirror assembly in FIGS. 10 and 11 that are the same as in FIGS. 2 and 6 carry the same reference numbers. As shown in FIG. 10, the mirror assembly 41 also includes a frame portion 43a, an intermediate gimbals portion 45 attached to frame portion 43a by hinges 55a and 55b and an inner mirror portion 29a attached to gimbals portion 45 by hinges 47a and 47b. However, instead of permanent magnets, mirror assembly 41a comprises a pair of conductive plates 151a and 151b mounted on gimbals portion 45a and a second pair of conductive plates 153a and 153b mounted on extended portions of mirror portion 29a. In addition, electrostatic plates 155 are mounted on surface 79 of support board 77. Plates 155 receive an electric charge from chips 69a and 67b by either elongated leads 157 or conductive balls 159 as shown on the left half and right half of FIG. 11, respectively. Although not shown, the mirror rotation of the mirror assembly of FIG. 10 is the same as discussed with respect to FIGS. 3a through 3d for the mirror assembly of FIGS. 2 and 3. It should also be appreciated that although the mirrors of FIG. 10 are shown with two axis of rotation, an effective mirror may also be provided with a single axis of rotation in the same manner as was discussed with respect to the coil drive mirror having a single axis of rotation shown in FIG. 5.

Referring now to FIG. 11, there is shown a cross-sectional view of the mirror assembly of FIG. 10. As shown, the component arrangement and structure is substantially the same as shown in FIG. 6, except electrostatic plates 155 have been substituted for the drive coils 75 illustrated in FIG. 6.

In addition, as mentioned heretofore, instead of using a photon sensing system to monitor mirror position, changes in capacitance may be used as shown in FIG. 11 capacitance changes at plate 161 due to mirror rotation may be monitored and provided to the control electronics.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed:

1. Drive apparatus having reduced internal wiring connections comprising:
    a base printed circuit board having a top side and a connecting side, said top side including a first plurality of connecting points and said connecting side including connections for receiving and sending electrical signals;
    at least one drive module located on said top side of said base printed circuit board, said module having input connections;
    a device support printed circuit board having a device side and a back side, said back side including a second plurality of connecting points and having a recess for receiving said drive module, said device support printed circuit board mounted to said base printed circuit board; and
    a third plurality of conductive members mounted between said base printed circuit board and said support printed circuit board such that selected ones of said second plurality of connecting points are in electrical contact with selected ones of said first plurality of connecting points.

2. The apparatus of claim 1 wherein said second plurality of connecting points is a mirror image of said first plurality of conductive connecting points.

3. The apparatus of claim 1 wherein said drive apparatus is a magnetic drive apparatus and said drive module includes a coil for providing an electromagnetic force.

4. The apparatus of claim 3 wherein said drive module includes a single coil.

5. The apparatus of claim 3 wherein said drive coil module includes two coils.

6. The apparatus of claim 3 wherein said drive coil module includes four coils.

7. The apparatus of claim 1 wherein said third plurality of conductive members mounted on said base printed circuit board to form a ball grid array (BGA).

8. The apparatus of claim 7 and further comprising a fourth plurality of conductive members mounted on said support printed circuit board such that other selected ones of said second plurality of connecting points are in electrical contact with other selected ones of said first plurality of connecting points.

9. The apparatus of claim 1 wherein said drive module comprises two drive coils connected in series to provide a magnetic field.

10. The apparatus of claim 1 wherein said mirror is rotatable about two axis.

11. The apparatus of claim 10 wherein said drive module comprises a first coil to provide a magnetic field for rotating said mirror about one axis and a second coil to provide a magnetic field for rotating said mirror about the other axis.

12. The apparatus of claim 10 wherein said drive module comprises a first pair of coils to rotate said mirror about one axis and a second pair of coils to rotate said mirror about the other axis.

13. The apparatus of claim 9 further comprising a pair of permanent magnets attached to said mirror one each of said pair proximate each coil.

14. The apparatus of claim 12 further comprising a first pair of permanent magnets attached to said mirror one each proximate each one of said first pair of coils and a second pair of permanent magnets attached to said mirror one each proximate each one of said second pair of coils; said apparatus further comprising a mirror mounted to said device side of said support printed circuit board and above said drive module, said mirror rotatable about an axis in response to a signal provided to said drive module.

15. The apparatus of claim 1 and further comprising mirror positioning sensing circuitry attached to said device side of said support printed circuit board.

16. The apparatus of claim 15 wherein said mirror positioning sensing circuitry comprises a photon source and at least one photo detector.

17. The apparatus of claim 16 wherein said at least one photo detector comprises two photo detectors.

18. The apparatus of claim 10 and further comprising mirror positioning sensing circuitry attached to said device side of said support printed circuit board.

19. The apparatus of claim 18 wherein said mirror positioning circuitry comprises a photon source and at least two photo detectors.

20. The apparatus of claim 19 wherein said at least two photo detectors comprises four photo detectors.

21. The apparatus of claim 1 wherein said third plurality of conductive members are mounted on said base printed circuit board to form a ball grid array (BGA).

22. The apparatus of claim 1 and further comprising a fourth plurality of conductive members mounted on said support printed circuit board such that other selected ones of said second plurality of connecting pointes are in electrical contact with other selected ones of said first plurality of connecting points.

23. The apparatus of claim 1 wherein said drive apparatus is an electrostatic drive apparatus and said drive module includes a plate for providing an electrostatic force.

24. The apparatus of claim 23 further comprising another electrostatic plate attached to said mirror one proximate one said electrostatic plate.

25. The apparatus of claim 1 wherein said drive apparatus is an electrostatic device apparatus to rotate said mirror and said drive module includes a plate for providing an electrostatic force to said rotatable mirror.

26. The apparatus of claim 10 wherein said drive apparatus is an electrostatic drive apparatus and said drive apparatus comprises a first plate for providing an electrostatic force to rotate said mirror about one axis and a second plate for providing an electrostatic force to rotate said mirror about the other axis.

27. The apparatus of claim 1 wherein said at least one drive module comprises an array of drive modules.

28. The apparatus of claim 27 and further comprising an array of mirrors mounted to said support printed circuit board and above said array of drive modules, each of said mirrors rotatable about an axis in response to a signal provided to one of said drive modules.

29. The apparatus of claim 28 wherein each of said array of mirrors is rotatable about 2 axis.

30. Rotatable optical mirror apparatus having reduced internal wiring connections comprising:
   a ball grid array printed circuit board (BGA-PCB) having a top side and a connecting side, said top side including a first plurality of conductive member connecting points and said connecting side including connections for receiving and sending electrical signals;
   at least one drive coil module located on said top side of said BGA-PCB, said drive coil module comprising two coils and said drive coil module further including input connections for said two drive coils;
   a support printed circuit board having a device side and a backside, said backside including a second plurality of contact points and having a recess for receiving said drive coil module, said device support printed circuit board mounted to said BGA-PCB to cover said drive coil module such that said second plurality of contact points make electrical contact with selected ones of said first plurality of conductive ball connection points;
   a mirror mounted to said device side of said support printed circuit board above said drive coil module, said mirror rotatable about an axis in response to a magnetic field;
   a pair of permanent magnets attached to said mirror one each proximate each coil of said drive coil module; and
   mirror positioning sensing circuitry attached to said device side of said support printed circuit board.

31. The apparatus of claim 30 wherein said mirror is rotatable about two axis and said drive coil module comprises a first pair of coils to rotate said mirror about one of said axis and a second pair of coils to rotate said mirror about the other axis.

32. An array of rotatable mirrors having reduced internal wiring connection comprising:
   a ball grid array printed circuit board (BGA-PCB) having a top side and a connecting side, said top side including a first plurality of conductive ball connecting points and said connecting side including a plurality of connections for receiving and sending electrical signals;
   an array of drive coil modules located on said top side of said BGA-PCB, each of said modules including a pair of coils and having input connections for each of said drive coils;
   a support printed circuit board having a device side and a backside, said backside including a second plurality of contact points and defining areas for receiving said array of drive coil modules, said support printed circuit board mounted to said BGA-PCB to cover said array of drive coil modules such that said second plurality of contact points make electrical contact with selected ones of said first plurality of conductive ball connection points;
   an array of mirrors mounted to said device side of said support printed circuit board, one each above a corresponding one of said drive coil modules and each of said mirrors rotatable about an axis in response to a magnetic field;
   a pair of permanent magnets attached to each of said mirrors, one each proximate each coil of said corresponding drive coil module; and
   each mirror further comprising mirror positioning sensing circuitry attached to said device side of said support printed circuit board.

33. The apparatus of claim 32 wherein each of said mirrors is rotatable about two axis, and each drive coil module includes a first pair of drive coils for rotating an adjacent mirror about one axis and a second pair of drive coils for rotating said adjacent mirror about the other axis.

34. The apparatus of claim 18 wherein said mirror positioning circuitry comprise an apparatus for sensing changes in capacitance due to mirror movement.

* * * * *